United States Patent
Lai et al.

(10) Patent No.: US 9,356,240 B1
(45) Date of Patent: May 31, 2016

(54) TETRAAMINO PYRAZINE BASED LADDER POLYMER FOR ELECTROACTIVE APPLICATIONS

(71) Applicants: William W. Lai, Ridgecrest, CA (US); Alfred J. Baca, Ridgecrest, CA (US)

(72) Inventors: William W. Lai, Ridgecrest, CA (US); Alfred J. Baca, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 512 days.

(21) Appl. No.: 13/667,115

(22) Filed: Nov. 2, 2012

(51) Int. Cl.
 *H01L 21/02* (2006.01)
 *H01L 51/00* (2006.01)
 *H01G 4/008* (2006.01)
 *H01L 51/05* (2006.01)

(52) U.S. Cl.
 CPC ............ *H01L 51/0044* (2013.01); *H01G 4/008* (2013.01); *H01L 51/0002* (2013.01); *H01L 51/0508* (2013.01)

(58) Field of Classification Search
 CPC  H01L 51/0044; H01L 51/0025; H01G 11/02; C09D 179/04; C08G 73/20
 USPC .......................................................... 257/532
 See application file for complete search history.

(56) References Cited

U.S. PATENT DOCUMENTS

| | | | | |
|---|---|---|---|---|
| 8,427,812 | B1 * | 4/2013 | Stenger-Smith | C07D 333/22 361/502 |
| 8,780,526 | B2 * | 7/2014 | Fleischer | B82Y 30/00 361/502 |
| 8,951,828 | B1 * | 2/2015 | Lai | H01G 11/02 257/40 |
| 2006/0070653 | A1 * | 4/2006 | Elrod | B82Y 10/00 136/263 |

* cited by examiner

*Primary Examiner* — Trung Q Dang
(74) *Attorney, Agent, or Firm* — Charlene A. Haley

(57) ABSTRACT

A method for making electronic devices based on derivatized ladder polymer (Pz-BBL) including photovoltaic modules and simple thin film transistors in planar and mechanically flexible and stretchable constructs.

5 Claims, 7 Drawing Sheets

TETRAAMINO PYRAZINE BASED LADDER POLYMER FOR ELECTROACTIVE APPLICATIONS

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

CROSS-REFERENCE TO RELATED APPLICATIONS

This is a non-provisional application, claiming the benefit of, parent application Ser. No. 61/562,529 filed on Nov. 22, 2011 and 61/562,122 filed on Nov. 21, 2011, whereby the entire disclosure of which is incorporated hereby reference.

FIELD OF THE INVENTION

The invention generally relates to air stable materials for use in high cycling devices (including supercapacitors and photovoltaics).

Figure 1:
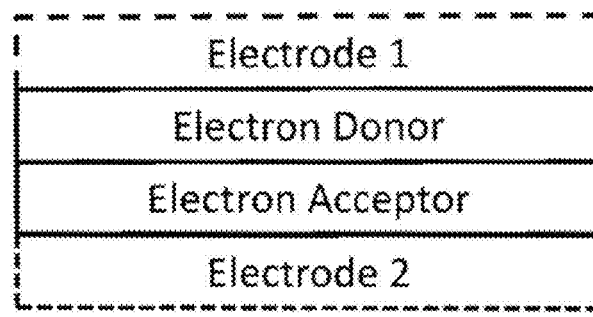
FIG. 1 is a side view of a cross section of device architect that will be incorporated with the materials described herein, according to embodiments of the invention.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

The invention generally relates to air stable materials for use in high cycling devices (including supercapacitors and photovoltaics).

An aspect of the invention generally relates to air stable materials for use in high cycling devices (supercapacitors, photovoltaic). In other words, stable electroactive ladder polymer for electronic device applications. We have previously reported that the replacement of pyridine (single nitrogen heterocycle) for benzene in the ladder polymer poly[7-oxo-7H-benzyl(d,e)imidazo(4',5':5,6)-benzimidazo(2,1-a) isoquinoline-3,4:10,11-tetrayl)-10-carbonyl] (BBL) results in a significant increase in oxidation stability. When this trend holds true, replacing the pyridine with a pyrazine (two nitrogen heterocycle) would further increase the material towards oxidative stability. The ultimate goal being an air stable material that can be incorporated into devices without the requirement for exotic packaging.

The natural progression would be the pyrazine version of BBL, which has not been reported. The ladder polymer BBL was first reported in the 60s by F. E. Arnold, along with several papers describing the thermal stability. In the 70s the pyridine version of the ladder polymer was reported by Dennis Scott Donald. We have conducted stability experiments on both BBL and pyridine BBL and have submitted several papers as well as presented several talks at professional conferences. In the 1974 Donald patent, the pathway towards tetraamino pyrazine was rather complicated with low yields. Since then a 2009 Tetrahedron paper describes a more direct pathway to one of the monomers. Patent Number 3808209 Arnold, F. E., Van Duesen, R. L., Macromolecules, 2, 497, 1969; Guillou, S., Jacob, G., Terrier, F., Goumont, R., Tetrahedron, 65, 8891,2009.

Starting with 2,6-dichloro pyrazine a methoxy displacement is done to increase the electron density of the ring in preparation to the nitration step. Attempts to nitrate directly did not result in the desired product. Following the methoxy addition to give 2,6-dimethoxy pyrazine, nitration was done according to standard sulfuric/nitric acid nitration conditions. Then ammonia is used to displace the methoxy groups at elevated temperatures. The nitro groups are then reduced using a tin HCl solution to give one of the monomers as the protected HCl salt. The other monomer, 1,4,5,8-naphthalene-tetracarboxylic dianhydride is commercially available. First the protected salt is changed to the free base under an inert atmosphere in hot polyphosphoric acid. Once the free base is made, portions of the dianhydride are added and various heating profiles are used to drive the dehydration reaction to completion. Processing of the crude polymer requires first pouring the hot reaction into water and methanol and washing out the acid and salts, followed by drying under vacuum.

Utilizing photovoltaic modules as power sources for navy applications have been constrained by the weight and non-conformal intrinsic layout of conventional photovoltaic modules and cost. The innovative science and technology produced from this work is the development of new applications for PV power. However, organic materials are less stable (n-type; air stable) then traditional PV materials including silicon. In this work we have developed a class of organic materials (derivatives of BBL polymers (Py-BBL and Pz-BBL)) for photovoltaic applications developed to meet the Navy's energy demands.

There is currently a strong demand for electron conducting, or n-type materials. Many power systems require a complementary architecture in order to realize maximum capacity. Whether the power system is a battery, a capacitor or a photovoltaic cell, for every cathode, there is an ideal anode, for every donor, there is an ideal acceptor. The problem arises with the large discrepancy of electron rich (p-type) materials when compared to the number of electron poor (n-type) materials. The root reason for this discrepancy can be seen in the relative energies of their corresponding excited states. By removing an electron from a p-type material, the resulting excited state is quite similar, this is because both the ground state and excited state energies is determined by the highest occupied molecular orbital (HOMO). The excited state energies of n-type materials on the other hand are usually determined by the lowest unoccupied molecular orbital (LUMO), which by definition is always higher than the HOMO. Problems with current PV devices based on organic materials that limit their use include: not air stable, thermal stability issues and performance degradation when exposed to an environment and conditions common for PV applications. Embodiments of the invention lead to materials with tunable energy levels and also improved redox and thermal stabilities, solubility and processability in comparison to commercially available BBL materials. The improvement provided by the derivatized BBL polymers leads to organic PV modules that are air stable and are more soluble in environmentally benign solvents for large area fabrication of thin films. Other related circuit component devices including field effect transistors and simple inverters are also demonstrated with materials.

Recent work in the area of n-type materials have centered on benzothiadiazole based polymers. Although these polymers have shown to have good electroactive properties, their synthetic pathways can be rather involved with yields that leave much to be desired. In terms of commercially available materials, a promising ladder polymer poly(benzo-isimidazobenzo phenanthroline) (BBL) has been shown to exhibit PV properties. Some disadvantages of commercially available BBL and current state of the art when in device form (i.e. solar cells, transistors, supercapcitors and others) include limited stability in functional devices. Derivatized BBL leads to enhanced performances in comparison to non-dervatized BBL. For example, comparing the normalized capacity of two supercapacitors with identical cathode materials (Poly ProDOT) with differing anodic materials (BBL vs. Py-BBL) we can see a noticeable difference in stability. After 80,000 seconds (10,000 cycles) the BBL device has lost 84% of its initial capacity, whereas Py-BBL has lost only 3% of its initial capacity. Collectively, these characterization results indicate that Py-BBL will serve as a great candidate for n-type photovoltaic materials.

Figure 2:
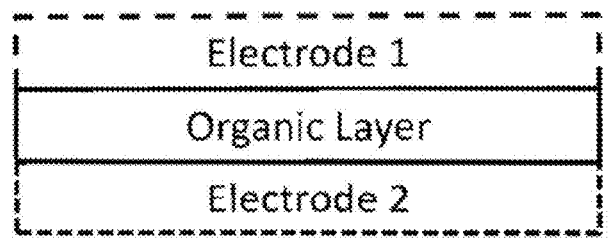
FIG. 2 is a side view of a cross section of device architect that will be incorporated with the materials described herein, according to embodiments of the invention.
Figure 3:
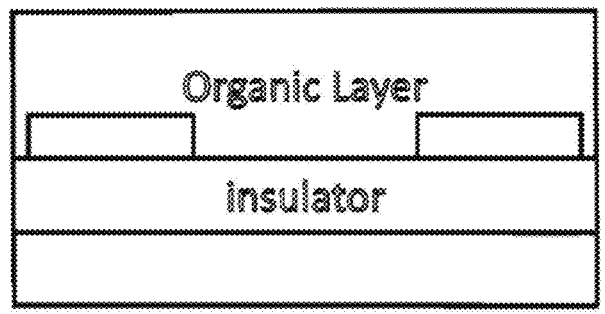
FIG. 3 is a side view of a cross section of device architect that will be incorporated with the materials described herein, according to embodiments of the invention.

Electronic devices based on derivatized ladder polymer poly(benzo-isimidazobenzo phenanthroline) (BBL) include but not limited to photovoltaic modules and simple thin film transistors in planar and mechanically flexible and stretchable constructs. FIGS. 1-3 are embodiments of device architects that will be incorporated with these materials. Large area thin film formation will be pursued via dissolving the polymer material in an acid, including methanesulfonic acid (MSA), forming a solution. Removing traces of the acid via solvent exposure leads to the formation of large area semiconducting ladder polymer films suitable for photovoltaic and other electronic devices. Depositing metal for contacts completes the fabrication process. These thin-film materials can be fabricated onto plastic and elastomeric substrates for mechanically flexible and stretchable constructs which will enhance the practical applications of devices. Thin films typically range from about 1-2 microns to be called thin films.

Figure 4:
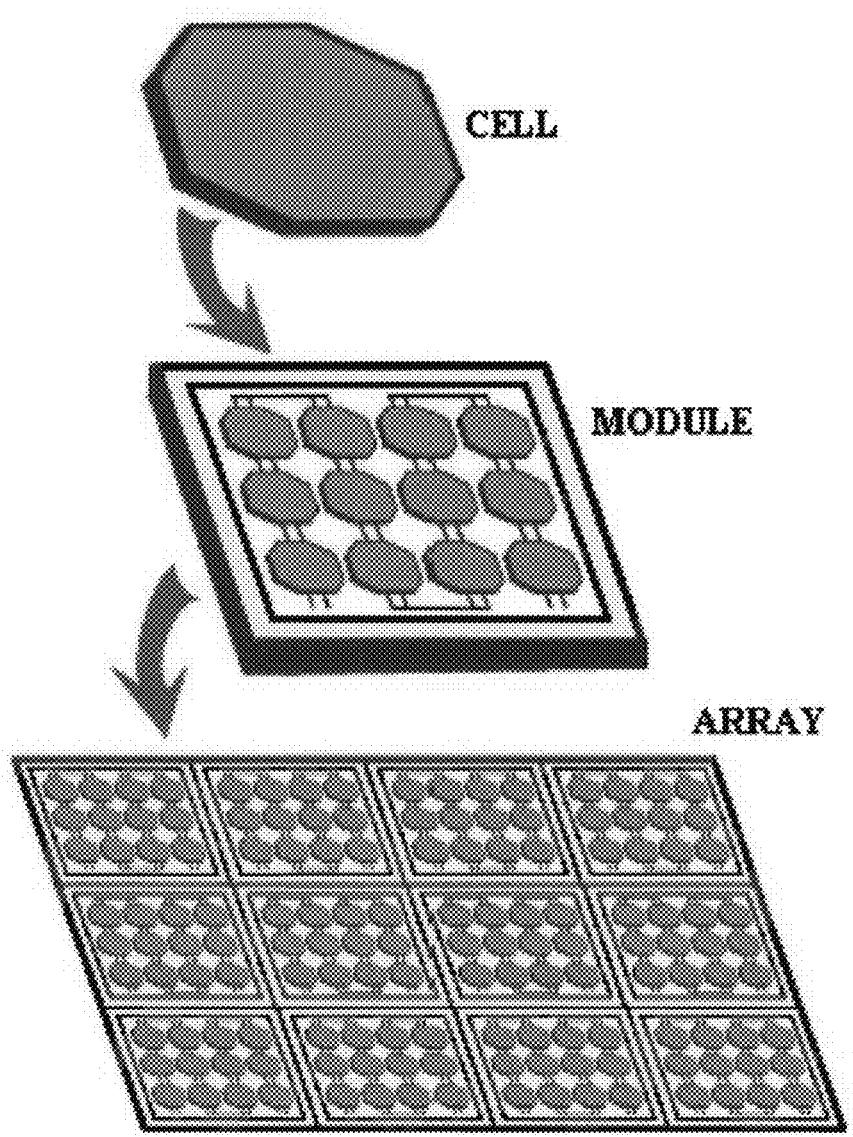
FIG. 4 is a prior art example of a typical solar cell system, according to embodiments of the invention.

A number of solar cells electrically connected to each other and mounted in a support structure or frame is called a photovoltaic module. As shown in FIG. 4, modules are constructed to supply electricity at a certain voltage, including a common 12 volts system. The current produced is proportional to how much light strikes the module.

Multiple modules can be wired together to form an array/ device. In general, the larger the area of a module or array, the more electricity that will be produced. Photovoltaic modules and arrays produce direct-current (DC) electricity. They can be connected in both series and parallel electrical arrangements to produce the required voltage and or current outputs. Science News Science@NASA Headline News, 2002, How do Photovoltaics Work.

Wiring Solar Cells Together in Series or Parallel

There are two ways individual solar cells can be wired together to form a device array:

1) Series wiring (positive to negative and negative to positive)

2) Parallel wiring (positive to positive and negative to negative)

Wiring solar cells in series will increase the voltage of the solar cell, but will not increase the amps. Wiring solar cells in parallel will increase the amps, but will not increase the voltage.

Using 3"×6" solar cell with 0.5 volts and 3.3 amps there are two different methods of wiring solar cells together drastically changes the power output of the solar cell (power stays the same, only the current and voltage change. Series equals higher voltages, parallel equals higher currents.)

Series Wiring

Take two 3"×6" solar cells by connecting the positive terminal of one cell to the negative terminal of another cell, and the negative terminal of the same cell to the positive terminal of the other cell, then have the series wired the two together creating an increase in voltage to 1 volt with the rated 3.3 amps not changing. When series wiring six of the solar cells together, that would give 3 volts (0.5×6) at 3.3 amps, and so on.

Parallel Wiring

Parallel wiring refers to connecting solar cells to increase amps, but not volts. For example, when you have two 0.5 volt solar cells rated at 3.3 amp hours, for example, by connecting the positive terminal of one solar cell to the positive terminal of the other, and the same with the negative terminal, then we will have parallel wired the two together. In this case, we now have a 0.5 volt solar cell and the rated 3.3 amps increases to 6.6 amp hours.

Connecting Solar Cells Together:

A single solar cell will not yield a lot of useful electricity, so you need to connect them together into a solar array— inside the solar panel. Connecting solar cells together is delicate process that should be done carefully and with a lot of attention. Each solar cell has a positive lead and a negative lead. There are two ways to connect solar cells into a module. The first method is to solder the tabs (or wires) that are already connected to the solar cells to the tabs or another solar cell, and the second way is to buy a metal solar cell ribbon and solder a strip of it to the back of each cell you want to connect (soldering to each of the six rectangular points on the cell). Using the solder ribbon to connect solar cells will more than double the time it takes you to create a solar panel, and leaves more room for errors and connectivity issues. (http://www.google.com/imgres imgurl=http://www.bradmerritt.com/wp-content/uploads/2010/06/solar_cell. gif&imgrefurl=http://www.bradmerritt.com/blogs/solar-power/solarcell&usg= _xLHNZQM7745KuMH8jdl4zyf85Mg=&h=461&w= 375&sz=30&hl=en& start=5&zoom=l&tbnid=YvEGna1gQ2OLbM: &tbnh=128&tbnw=104&ei=swFZUPrJMYXyigKA hYDIDg&prev=/images%3Fq%3Dso-lar%2Bcell%2Bimages%2Bphotos%26hl%3Den-%26sa%3D X%26gbv%3D2%26tbm%3Disch&itbs=1)

Capacitor

Figure 5:
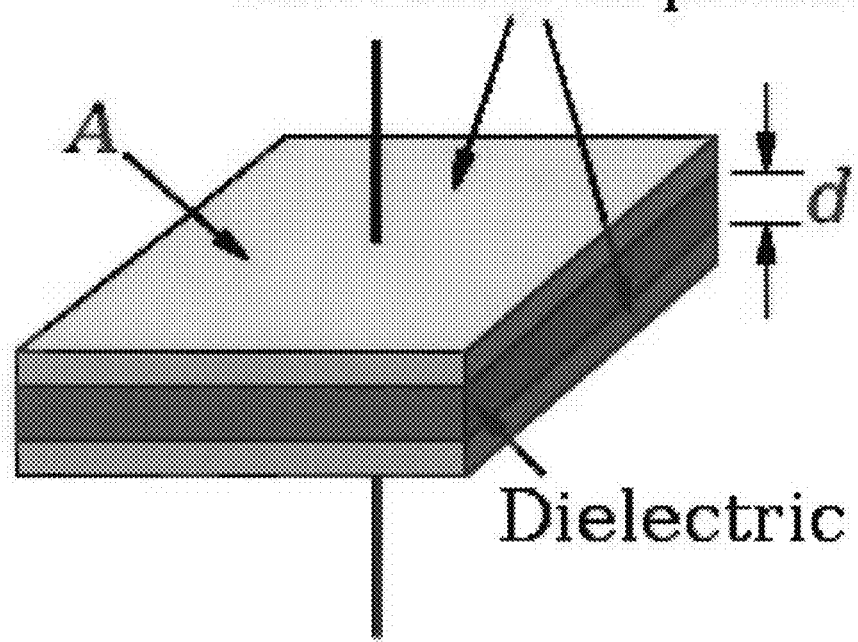
FIG. 5 is a perspective view of a capacitor having two metal/metal oxide plates that store charge on the surface, according to embodiments of the invention.

The definition of a capacitor is a simple energy storage device where the charge is stored on the surface (surface charge). A capacitor is composed of two plates, these are made of metal or metal oxides that are kept separated so they do not prematurely discharge. The separator is commonly a dielectric (insulator). Since charge is stored on the surface, the amount of charge stored is largely independent of material thickness and only the surface area (A) and the distance between the two plates are relevant (FIG. 5). FIG. 5. Capacitor, two metal/metal oxide plates that store charge on the surface.

Battery (Supercapacitor Battery)

Figure 6:
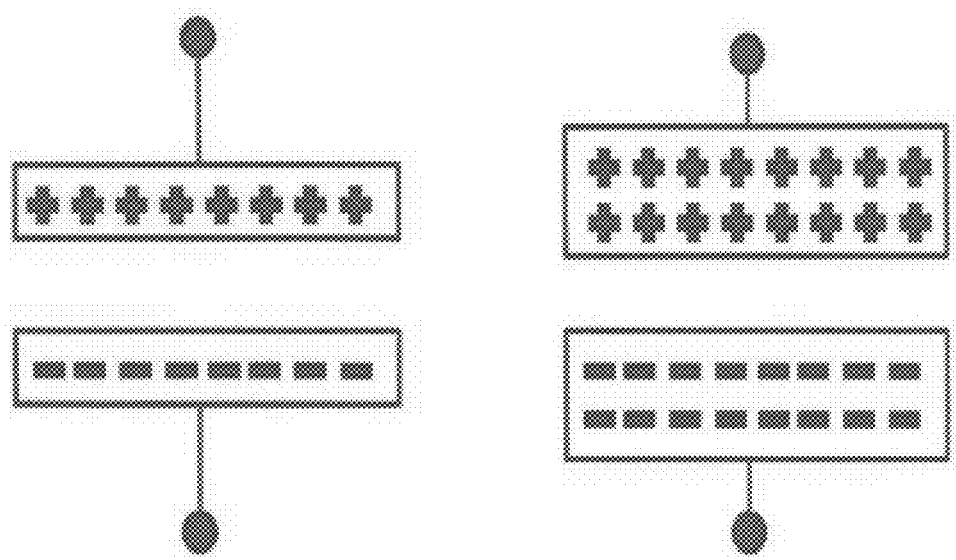
FIG. 6 is a side perspective view of Redox batteries store charge in bulk state, according to embodiments of the invention.

Different from capacitor mainly due to bulk charge storage. In the case of redox batteries both the thickness and surface area is important (FIG. 6). FIG. 6. Redox batteries store charge in bulk state. Thicker films equate to more charge. Like capacitors, the two materials have to be separated to keep from shorting out. In our case, we use separator paper (tissue paper), but anything that allows for the transport of electrons while keeping the two electrodes from touching is sufficient.

The "active" components for the battery are the donor and acceptor material. These terms are very generic. During the discharging phase, the active material can undergo redox processes of negative going to neutral, positive going to neutral, positive and negative going to neutral and several other combinations. To get the best results (largest voltage window) we use a dedicated donor (good: poly ProDOT, MEH-PPV, maybe P3HT) and a dedicated acceptor (BBL, Py-BBL, Pz-BBL).

Figure 7:
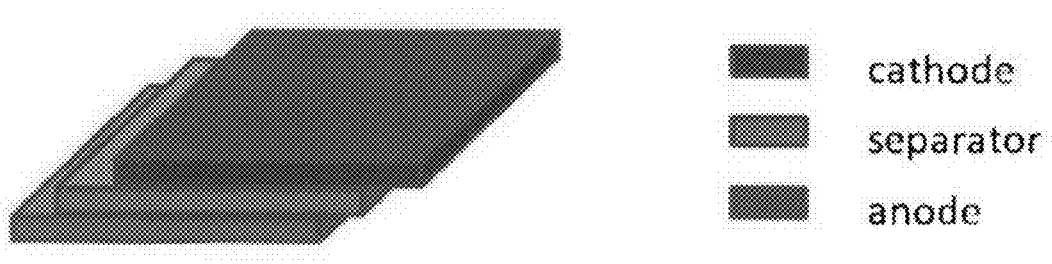
FIG. 7 is a side perspective view of TFT devices composed of substrate, insulator, organic semiconducting material, source, drain and gate metal contacts, according to embodiments of the invention.

Based on the convention that we use, the acceptor film is the anode and the donor film is the cathode. TFT devices composed of substrate, insulator, organic semiconducting material, source, drain and gate metal contacts as shown in FIG. 7. Forming the device starts by taking a substrate which can be composed of silicon, Ge, Quartz wafers, glass, plastic materials including polyethylene, and or elastomeric substrate including polydimethylsiloxane and depositing a gate metal composed of a highly conductive metallic material. Gate metals including Au, Ag, Pt, Pd or Cu all can be used. In some cases conducting polymers and graphite inks can also be used. In most cases a degenerately doped silicon wafer can act as a substrate and a gate metal. Gate insulator composed of any intrinsically insulating material commonly used in transistor devices, such as, silicon dioxide, silicon nitride, alumina oxide, and hafnium oxide (High-K dielectric materials) is formed on top of the gate metal. In some instances polymers and elastomers including epoxies, polyimides, and polydimethylsiloxanes can also be used as insulators. Source and drain electrodes composed of Au and Ag formed next onto of the insulator. Copper can also be used as a source and drain, and in other embodiments organic materials including graphene, carbon nanotubes can also be used. Spinning a thin film of a semiconducting organic layer including Py-BBL on top of the source and drain materials completes the device fabrication.

Inverter: Complementary inverter devices composed of substrate, insulators, p and n channel organic semiconducting materials, source, drain and gate metal contacts as shown in FIG. 7. Forming the device starts by taking a substrate which can be composed of silicon, Ge, Quartz wafers, glass, plastic materials including polyethylene, and or elastomeric substrate including polydimethylsiloxane and depositing a gate metal composed of a highly conductive metallic material. Gate metals including Au, Ag, Pt, Pd or Cu all can be used. In some cases conducting polymers and graphite inks can also be used. In most cases a degenerately doped silicon wafer can act as a substrate and a gate metal. Gate insulator composed of any intrinsically insulating material commonly used in transistor devices, including, silicon dioxide, silicon nitride, alumina oxide, and hafnium oxide (High-K dielectric materials) is formed on top of the gate metal. In some instances polymers and elastomers including epoxies, polyimides, and polydimethylsiloxanes can also be used as insulators. Source and drain electrodes composed of Au and Ag formed next onto of the insulator. Copper can also be used as a source and drain, and in other embodiments organic materials including graphene, carbon nanotubes can also be used. Spinning a thin film of a n-type semiconducting organic layer including Py-BBL on top of the source and drain n-channel contacts followed by deposition of a p-type (polythiophene, C-60) layer on the p-channel source and drain contacts completes the device fabrication.

PV Cells: Organic PV devices composed of substrate, organic acceptor and donor semiconducting materials, cathode and anode metal contacts as shown in FIG. 4. Forming the device starts by taking a substrate which can be composed of silicon, Ge, Quartz wafers, glass, plastic materials including polyethylene, and or elastomeric substrate including polydimethylsiloxanes and depositing a cathode electrode composed of highly conductive metals and metal oxides materials including Au, Ag, Al, and ITO. Electron acceptor materials including polythiophene, MEH-PPV and other p-type organic polymers serve as the electron acceptor material while in this embodiment the electron donor material will be composed of Py-BBL. Deposition of a thin metal film or metal oxides including Ag, Au, Al, Pt, and ITO completes the device fabrication. This embodiment represents a single cell and stringing together several other single cells in either parallel or series interconnections forms the solar modules.

Embodiments of the invention generally relate to methods for making thin film materials including, dissolving the Py-BBL in an acid solution, removing traces of the acid via solvent exposure, and forming of at least one semiconducting ladder polymer films. Other embodiments of the invention generally relate to methods for making thin film materials including, dissolving the Pz-BBL in an acid solution, removing traces of the acid via solvent exposure, and forming of at least one semiconducting ladder polymer films. Embodiments further include depositing metal onto the thin film(s) to act as contacts. Other embodiments include fabricating the thin film onto plastic and elastomeric substrates for mechanically flexible and stretchable constructs.

Another aspect of the invention generally relates to capacitors having a thin film material including, at least two conductive plates having metal or metal oxides, wherein each metal/metal oxide plates are spaced apart in that they do not prematurely discharge, wherein one plate is positively charged and one plate is negatively charged, and at least one separator having a dielectric insulator, wherein the separator is associated between each conductive plates forming a thin film. In embodiments, at least one plate is selected from the group consisting of BBL and Py-BBL. In other embodiments, the plates are a donor cathode and an acceptor anode in the form of a thin film. In embodiments, the donor cathode is selected from the group consisting of polyProDOT and MEH-PPV. In yet other embodiments, at least one plate is selected from the group consisting of polyProDOT and MEH-PPV. In other embodiments, the donor cathode includes P3HT. In embodiments, the separator includes a material that permits electrons to pass through. In yet other embodiments, at least one plate is selected from the group consisting of BBL and Pz-BBL.

Another aspect of the invention generally relates to photovoltaic devices having thin-film material including, thin film material(s) having at least one substrate, at least two electrodes having at least one anode and at least one cathode, where at least one electrode is associated with the substrate, and at least one organic layer having Py-BBL, where the organic layer is associated between at least one anode and at least one cathode. Another aspect of the invention generally relates to photovoltaic devices having thin-film material including, thin film material(s) having at least one substrate, at least two electrodes having at least one anode and at least one cathode, where at least one electrode is associated with the substrate, and at least one organic layer having Pz-BBL, where the organic layer is associated between at least one anode and at least one cathode.

In embodiments, the organic layer includes at least one semiconducting donor material having Py-BBL and at least one organic acceptor. In other embodiments, the organic layer includes at least one semiconducting donor material having Pz-BBL and at least one organic acceptor. In embodiments, at least one substrate is selected from the group consisting of silcon, Ge, Quartz wafers, glass, plastics including polyethylene, and elastomers including polydimethylsiloxanes. In embodiments, the electrodes include highly conductive metals and/or metal oxides are selected from the group consisting of Au, Ag, Al, and indium tin oxide (ITO). In embodiments, at least one organic acceptor is selected from the group consisting of polythiophene, MEH-PPV, and like p-type organic polymers. In embodiments, the thin film represents a single cell which is either electrically connected in parallel or series to form solar modules. In embodiments, the modules are electrically connected to form a photovoltaic array/device.

Another aspect of the invention generally relates to transistors having thin-film material including, at least one substrate, at least one gate metal contact, thin film material(s) having at least one organic semiconducting material layer, where at least one organic semiconducting layer is Py-BBL, at least one insulator, where the gate metal is associated with the insulator, at least one source electrode and at least one drain electrode, where the insulator is associated with the source electrode and the insulator is associated with the drain electrode, and where the gate metal is associated with the substrate, where the organic semiconducting layer is associated with the source electrode, associated with the drain electrode, and associated with the insulator. Another aspect of the invention generally relates to transistors having thin-film material including, at least one substrate, at least one gate metal contact, thin film material(s) having at least one organic semiconducting material layer, where at least one organic semiconducting layer is Pz-BBL, at least one insulator, where the gate metal is associated with the insulator, at least one source electrode and at least one drain electrode, where the insulator is associated with the source electrode and the insulator is associated with the drain electrode, and where the gate metal is associated with the substrate, where the organic semiconducting layer is associated with the source electrode, associated with the drain electrode, and associated with the insulator.

In embodiments, at least one substrate is selected from the group consisting of silcon, Ge, Quartz wafers, degenerately doped silicon wafers, glass, plastics including polyethylene, and elastomers including polydimethylsiloxanes. In embodiments, the gate metal is selected from the group consisting of Au, Ag, Pt, Pd, and Cu. In other embodiments, the gate metal is selected from the group consisting of polymers, degenerately doped silicon wafers, and graphite inks. In embodiments, the insulator is selected from the group consisting of silicon dioxide, silicon nitride, alumina oxide, hafnium oxide, and high-K dielectric materials. In other embodiments, the insulator is at least one polymer and/or elastomer selected from the group consisting of epoxies, polyimides, and polydimethylsiloxanes. In embodiments, the source electrode and/or drain electrode are made of materials selected from the group consisting of Au and Ag. In other embodiments, the source electrode and/or drain electrode are made of Cu. In yet other embodiments, source electrode and/or drain electrode are made of materials selected from the group consisting of graphene and carbon nanotubes.

Another aspect of the invention generally relates to transistors having thin-film material including, at least one substrate, at least one gate metal contact, where the gate metal is associated with the substrate, thin film material(s) having at least one insulator, where the gate metal is associated with the insulator, at least one drain electrode, at least one n-source material to form at least one n-source channel, at least one p-source material to form at least one p-source channel, where the n-source channel and the p-source channel are associated with the drain electrode and with the insulator, where the insulator is associated with the source electrode and the insulator is associated with the drain electrode, and at least one organic semiconducting layer, where at least one organic semiconducting layer is Py-BBL, where the organic semiconducting layer is associated with the n-channel source and the drain, where the organic semiconducting layer is associated with the p-channel source and the drain.

Another aspect of the invention generally relates to transistors having thin-film material including, at least one substrate, at least one gate metal contact, where the gate metal is associated with the substrate, thin film material(s) having at least one insulator, where the gate metal is associated with the insulator, at least one drain electrode, at least one n-source material to form at least one n-source channel, at least one p-source material to form at least one p-source channel, where the n-source channel and the p-source channel are associated with the drain electrode and with the insulator, where the insulator is associated with the source electrode and the insulator is associated with the drain electrode, and at least one organic semiconducting layer, where at least one organic semiconducting layer is Pz-BBL, where the organic semiconducting layer is associated with the n-channel source and the drain, where the organic semiconducting layer is associated with the p-channel source and the drain.

In embodiments, at least one substrate is selected from the group consisting of silicon, Ge, Quartz wafers, degenerately doped silicon wafers, glass, plastics including polyethylene, and elastomers including polydimethylsiloxanes. In embodiments, the gate metal is selected from the group consisting of Au, Ag, Pt, Pd, and Cu. In other embodiments, the gate metal is selected from the group consisting of polymers, degenerately doped silicon wafers, and graphite inks. In embodiments, the insulator is selected from the group consisting of silicon dioxide, silicon nitride, alumina oxide, hafnium oxide, and high-K dielectric materials. In other embodiments, the insulator is at least one polymer and/or elastomer selected from the group consisting of epoxies, polyimides, and polydimethylsiloxanes. In embodiments, the source electrode and/or drain electrode are made of materials selected from the group consisting of Au and Ag.

In embodiments, the source electrode and/or drain electrode are made of Cu. In embodiments, the source electrode and/or drain electrode are made of materials selected from the group consisting of graphene and carbon nanotubes. In embodiments, the p-channel and p-drain are made of materials selected from the group consisting of polythiophene and fullerene (C-60).

Another aspect of the invention generally relates to thin films including, at least one organic layer, where at least one organic layer is Py-BBL, and at least two metal contacts, where the organic layer being Py-BBL is associated between each metal contact. Another aspect of the invention generally relates to thin films including, at least one organic layer, where at least one organic layer is Pz-BBL, and at least two metal contacts, where the organic layer being Pz-BBL is associated between each metal contact.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention. While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A capacitor having a thin film material, comprising:
   at least two conductive plates having metal or metal oxides, wherein each said metal/metal oxide plates are spaced apart in that they do not prematurely discharge, wherein one said plate is positively charged and one said plate is negatively charged, wherein said plates are a donor cathode and an acceptor anode in the form of a thin film, wherein said acceptor anode is Pz-BBL; and
   at least one separator having a dielectric insulator, wherein said separator is associated between each said conductive plates forming a thin film.

2. The capacitor according to claim 1, wherein said donor cathode is selected from the group consisting of polyProDOT and MEH-PPV.

3. The capacitor according to claim 1, wherein said donor cathode includes P3HT.

4. The capacitor according to claim 1, wherein said separator includes a material that permits electrons to pass through.

5. A thin film, comprising:
   at least one organic layer, wherein at least one said organic layer is Pz-BBL; and
   at least two metal contacts, wherein said organic layer being Pz-BBL is associated between each said metal contact.

* * * * *